(12) United States Patent
Lee et al.

(10) Patent No.: US 7,227,236 B1
(45) Date of Patent: Jun. 5, 2007

(54) IMAGE SENSOR PACKAGE AND ITS MANUFACTURING METHOD

(75) Inventors: Chang Deok Lee, Gyeonggi-do (KR); Do Hyun Na, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/115,574

(22) Filed: Apr. 26, 2005

(51) Int. Cl.
  *H01L 31/0232* (2006.01)
  *H01L 31/062* (2006.01)
  *H01L 33/00* (2006.01)

(52) U.S. Cl. .................. 257/433; 257/432; 257/98; 257/294; 257/434; 257/435; 257/436; 257/437; 438/106; 438/65; 438/48

(58) Field of Classification Search .............. None
See application file for complete search history.

(56) References Cited

U.S. PATENT DOCUMENTS

| | | | |
|---|---|---|---|
| 3,880,528 A | 4/1975 | Petersen et al. | 356/225 |
| 4,055,761 A | 10/1977 | Shimomura | 250/239 |
| 4,491,865 A | 1/1985 | Danna et al. | 358/98 |
| 4,896,217 A | 1/1990 | Miyazawa et al. | 358/213.11 |
| 4,999,142 A | 3/1991 | Fukushima et al. | 264/1.7 |
| 5,023,442 A | 6/1991 | Taniguchi et al. | 250/208.1 |
| 5,068,713 A | 11/1991 | Toda | 357/72 |
| 5,122,861 A | 6/1992 | Tamura et al. | 357/74 |
| 5,220,198 A | 6/1993 | Tsuji | 257/731 |
| 5,274,456 A | 12/1993 | Izumi et al. | 358/209 |
| 5,365,101 A | 11/1994 | Tonai | 257/434 |
| 5,383,034 A | 1/1995 | Imamura et al. | 358/474 |
| 5,400,072 A | 3/1995 | Izumi et al. | 347/335 |
| 5,412,229 A | 5/1995 | Kuhara et al. | 257/183 |
| 5,424,531 A | 6/1995 | O'Regan et al. | 250/216 |
| 5,434,682 A | 7/1995 | Imamura et al. | 358/474 |
| 5,436,492 A | 7/1995 | Yamanaka | 257/433 |
| 5,444,520 A | 8/1995 | Murano | 355/229 |
| 5,463,229 A | 10/1995 | Takase et al. | 257/59 |
| 5,489,995 A | 2/1996 | Iso et al. | 358/483 |
| 5,523,608 A | 6/1996 | Kitaoka et al. | 257/433 |
| 5,570,204 A | 10/1996 | Kumashiro | 358/471 |
| 5,581,094 A | 12/1996 | Hara et al. | 257/80 |

(Continued)

FOREIGN PATENT DOCUMENTS

GB    1022329    7/1964

(Continued)

*Primary Examiner*—Evan Pert
*Assistant Examiner*—Fazil Erdem
(74) *Attorney, Agent, or Firm*—Gunnison, McKay & Hodgson, L.L.P.; Serge J. Hodgson

(57) ABSTRACT

Disclosed are an image sensor package and its manufacturing method. As an example, an infrared ray protection glass is positioned directly on an image sensing region of an image sensor die. An electrically conductive wire and so forth located outside the image sensing region are encapsulated. At this time, one surface of the infrared ray protection glass is exposed outwardly. A mount holder to which a barrel with lenses is coupled is adhered on a surface of the encapsulant outside the infrared ray protection glass. The mount holder has a similar width to that of the image sensor die. Accordingly, the overall width of the image sensor package can become reduced, and the electrically conductive wire is protected against oxidization because it is surrounded by the encapsulant.

20 Claims, 8 Drawing Sheets

U.S. PATENT DOCUMENTS

| | | | |
|---|---|---|---|
| 5,604,362 A | 2/1997 | Jedlicka et al. | 257/233 |
| 5,617,131 A | 4/1997 | Murano et al. | 347/233 |
| 5,655,189 A | 8/1997 | Murano | 399/220 |
| 5,672,902 A | 9/1997 | Hatanaka et al. | 257/431 |
| 5,783,815 A | 7/1998 | Ikeda | 250/208.1 |
| 5,804,827 A | 9/1998 | Akagawa et al. | 250/370.06 |
| 5,811,799 A | 9/1998 | Wu | 250/239 |
| 5,821,532 A | 10/1998 | Beaman et al. | 250/239 |
| 5,825,560 A | 10/1998 | Ogura et al. | 359/822 |
| 5,861,654 A | 1/1999 | Johnson | 257/433 |
| 5,902,993 A | 5/1999 | Okushiba et al. | 250/208.1 |
| 5,932,875 A | 8/1999 | Chung et al. | 250/239 |
| 5,998,878 A | 12/1999 | Johnson | 257/797 |
| 6,011,294 A | 1/2000 | Wetzel | 257/434 |
| 6,011,661 A | 1/2000 | Weng | 359/819 |
| 6,020,582 A | 2/2000 | Bawolek et al. | 250/208.1 |
| 6,037,655 A | 3/2000 | Philbrick et al. | 257/680 |
| 6,060,722 A | 5/2000 | Havens et al. | 250/566 |
| 6,072,232 A | 6/2000 | Li et al. | 257/680 |
| 6,122,009 A | 9/2000 | Ueda | 348/335 |
| 6,130,448 A | 10/2000 | Bauer et al. | 257/222 |
| 6,147,389 A | 11/2000 | Stern et al. | 257/434 |
| 6,153,927 A | 11/2000 | Raj et al. | 257/680 |
| 6,184,514 B1 | 2/2001 | Rezende et al. | 250/208.1 |
| 6,384,397 B1 | 5/2002 | Takiar et al. | 250/208.1 |
| 6,384,472 B1 | 5/2002 | Huang | 257/680 |
| 6,392,703 B1 | 5/2002 | Uchino et al. | 348/373 |
| 6,476,417 B2 | 11/2002 | Honda et al. | 257/59 |
| 6,483,101 B1 | 11/2002 | Webster | 250/216 |
| 6,498,624 B1 | 12/2002 | Ogura et al. | 348/335 |
| 6,509,560 B1 | 1/2003 | Glenn et al. | 250/239 |
| 6,518,656 B1 | 2/2003 | Nakayama et al. | 257/680 |
| 6,627,864 B1 | 9/2003 | Glenn et al. | 250/208.1 |
| 6,627,872 B1 | 9/2003 | FuKamura et al. | 250/239 |
| 6,762,796 B1 | 7/2004 | Nakajoh et al. | 348/340 |
| 6,767,753 B2 | 7/2004 | Huang | 438/25 |
| 6,798,031 B2 | 9/2004 | Honda et al. | 257/433 |
| 6,813,099 B2 | 11/2004 | Yamaguchi | 359/779 |
| 6,867,438 B1 | 3/2005 | Maruyama et al. | 257/184 |
| 6,870,238 B2 | 3/2005 | Exposito et al. | 257/431 |
| 6,939,456 B2 | 9/2005 | Shiau | 250/208.1 |
| 7,031,083 B2 | 4/2006 | Chen | 359/819 |
| 2003/0137595 A1 | 7/2003 | Takachi | 348/340 |
| 2004/0065952 A1 | 4/2004 | Prior | 257/724 |
| 2004/0217454 A1 | 11/2004 | Brechignac et al. | 257/678 |
| 2004/0251509 A1 | 12/2004 | Choi | 257/432 |
| 2005/0073036 A1 | 4/2005 | Appelt et al. | 257/678 |
| 2005/0104991 A1 | 5/2005 | Hoshino et al. | 348/340 |
| 2005/0258350 A1 | 11/2005 | Van Arendonk et al. | 250/239 |
| 2005/0258518 A1* | 11/2005 | Yang et al. | 257/666 |
| 2006/0016973 A1* | 1/2006 | Yang et al. | 250/239 |

FOREIGN PATENT DOCUMENTS

| | | |
|---|---|---|
| GB | 2 146 504 | 4/1985 |
| JP | 59-228755 | 12/1984 |
| JP | 62-224047 | 10/1987 |
| JP | 09-021938 | 1/1997 |
| JP | 09-232548 | 9/1997 |
| JP | 10-302587 | 11/1998 |
| WO | WO 93/22787 | 11/1993 |
| WO | WO 00/038103 | 6/2000 |
| WO | WO 03/019660 | 3/2003 |

* cited by examiner

IMAGE SENSOR PACKAGE AND ITS MANUFACTURING METHOD

BACKGROUND OF THE INVENTION

1. Field of the Invention

The present invention relates to an image sensor package and its manufacturing method.

2. Description of the Related Art

In general, an image sensor is a device for sensing subject information and converting the sensed subject information into an image signal. Such an image sensor is roughly divided into two types, that is, a camera tube and a solid image sensor; the former includes a vidicon, a plumbicon, etc., and the latter includes a Complementary Metal Oxide Semiconductor (CMOS), a Charge Coupled Device (CCD) or the like. Among other things, the solid image sensor is currently manufactured in such a manner that a barrel having a lens is coupled to a CMOS image sensor die or a CCD image sensor die.

As an example, a conventional image sensor package includes a substrate, an image sensor die adhered on the substrate, electrically conductive wires for electrically connecting the substrate and the image sensor die to each other, a mount holder attached on the substrate along outer peripheries of the image sensor die and the wires, and a barrel having a lens and coupled to the mount holder.

Of course, an external image passes through the lens of the barrel and is then converted into an electrical signal in the image sensor die, and the converted electrical signal is delivered to an external device via the wires and the substrate.

In such a conventional image sensor package, however, there is a problem in that the image sensor die is wholly exposed to the outer atmosphere during sawing, die attaching and wire bonding processes, so that its optical performance becomes deteriorated. That is, during the sawing process in which a wafer is sawn into image sensor die pieces by a diamond blade, etc., many particles are generated and thus the image sensor die is contaminated with the particles, which results in lowering in optical performance of the image sensor die. The image sensor die is also contaminated with particles during the die attaching and wire bonding processes, in which it is attached to the substrate and wires are bonded between the image sensor die and the substrate, thereby becoming further deteriorated in its optical performance.

Moreover, the conventional image sensor package has another problem in that the whole package has a large width because the mount holder and the barrel are adhered on the substrate along the outer periphery of the image sensor die. In other words, the mount holder and the barrel, which are only secondary components, have larger widths than that of the image sensor die which practically processes the external image, thereby unnecessarily enlarging the width of the package.

Furthermore, the conventional image sensor package is less reliable because the wires are not encapsulated by an encapsulant, but exposed to air, so that they may be contaminated and easily oxidized.

BRIEF SUMMARY OF THE INVENTION

Disclosed are an image sensor package and its manufacturing method. As an example, an infrared ray protection glass is positioned directly on an image sensing region of an image sensor die. An electrically conductive wire and so forth located outside the image sensing region are encapsulated. At this time, one surface of the infrared ray protection glass is exposed outwardly. A mount holder to which a barrel with lenses is coupled is adhered on a surface of the encapsulant outside the infrared ray protection glass. The mount holder has a similar width to that of the image sensor die. Accordingly, the overall width of the image sensor package can become reduced, and the electrically conductive wire is protected against oxidization because it is surrounded by the encapsulant.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
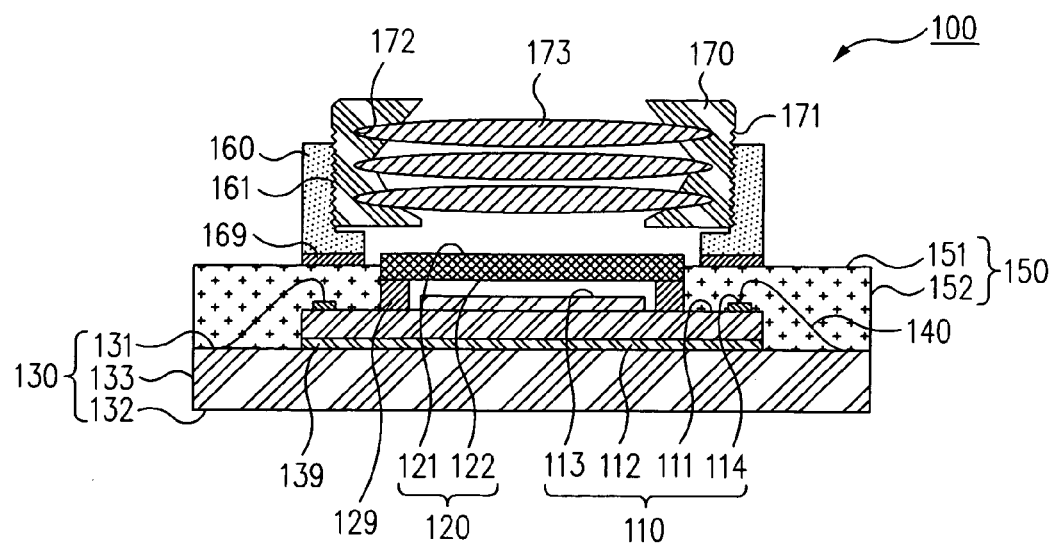
FIG. 1 is a sectional view of an image sensor package in accordance with an embodiment of the present invention.

Referring to FIG. 1, an image sensor package 100 in accordance with an embodiment of the present invention is shown in section.

As shown in the drawing, the image sensor package 100 according to the present invention includes an image sensor die 110 for sensing an external image and converting it into an electrical signal, an infrared ray protection glass 120 seated on the image sensor die 110, a substrate 130 attached to the image sensor die 110, electrically conductive wires 140 for electrically connecting the image sensor die 110 and the substrate 130 to each other, an encapsulant 150 for encapsulating the image sensor die 110, the infrared ray protection glass 120, the substrate 130 and the electrically conductive wires 140 while exposing a defined region of the infrared ray protection glass 120 to the outside, a mount holder 160 adhered to a surface of the encapsulant 150, and a barrel 170 coupled to the inside of the mount holder 160 to appropriately focus the external image and let it be incident to the image sensor die 110.

First of all, the image sensor die 110 has a first approximately planar surface 111 and a second approximately planar surface 112 opposite to the first surface 111. The first surface 111 of the image sensor die 110 is formed in about its middle portion with an image sensing region 113 for sensing an external image and converting it into an electrical signal, and at least a bond pad 114 is formed outside the first surface 112 at a distance from the image sensing region 113. In other words, the bond pad 114 is mainly formed just inside edges of the first surface 111 of the image sensor die 110. Of course, such an image sensor die 110 may be any one of a CMOS type and a CCD type.

The infrared ray protection glass 120 is located above the image sensing region 113 of the image sensor die 110. Of course, the infrared ray protection glass 120 has a larger area than that of the image sensing region 113 so that it can completely cover the image sensing region 113. Also, an adhesive 129 having a larger thickness than that of the image sensing region 113 is attached to the first surface 111 of the image sensor die 110 outside the image sensing region 113, and the infrared ray protection glass 120 is adhered on the adhesive 129. To be specific, the infrared ray protection glass 120 has a first approximately planar surface 121 and a second approximately planar surface 122 opposite to the first surface 121, and is adhered to the adhesive 129 at the second surface 122. This adhesive 129 may be an ordinary one such as an epoxy adhesive, a double-faced adhesive tape, a double-faced adhesive film or equivalents thereof, but its type need not be limited to these. In addition, the infrared ray protection glass 120 serves to intercept infrared rays incident to the image sensing region 113, thereby preventing the deterioration of image quality.

The substrate 130 has a first approximately planar surface 131 and a second approximately planar surface 132 opposite to the first surface 131. The substrate 130 also has a third surface 133 which extends from a common end (edge) of the first surface 131 and the second surface 132 while forming a right angle with respect to them. In addition, the second surface 112 of the image sensor die 110 is adhered on about the middle portion of the first surface 131 of the substrate 130 by means of the adhesive 139. Of course, the substrate 130 has a larger area than that of the image sensor die 110 so as to facilitate the wire bonding between the image sensor die 110 and the substrate 130. Although not concretely shown, this substrate 130 may be an ordinary one such as a hard printed circuit board, a soft printed circuit board, a lead frame or equivalents thereof, but its type need not to be limited to these. Also, electrically conductive patterns or leads for the connection to the electrically conductive wires 140 may be formed on a surface of the substrate 130, but they are not shown in the drawing. Similar to the adhesive 129, the adhesive 139 for connecting the image sensor die 110 and the substrate 130 to each other may be an ordinary one such as an epoxy adhesive, a double-faced adhesive tape, a double-faced adhesive film or equivalents thereof, but its type need not be limited to these.

The electrically conductive wires 140 electrically connect the bond pads 114 and the substrate 130 to each other. That is, the electrically conductive wires 140 serve to electrically connect the bond pads 114 formed on the first surface 111 of the image sensor die 110 and the electrically conductive patterns or the leads (not shown) formed on the first surface 131 of the substrate 130 to each other. It is obvious that the electrically conductive wires 140 are formed as many as the bond pads 114 are formed. That is, the number of the electrically conductive wires 140 is at least one. Moreover, the electrically conductive wires 140 may be an Al wire, an Au wire, an Ag wire, a Cu wire or equivalents thereof, but its material need not be limited to these.

The encapsulant 150 covers the image sensor die 110, the substrate 130 and the electrically conductive wires 140 outside the infrared ray protection glass 120 and the adhesive 129. By such an encapsulant 150, the image sensor die 110, the substrate 130 and the electrically conductive wires 140 are safely protected against external mechanical, chemical or electrical shocks and oxidization phenomena. The encapsulant 150 encompasses sides of the infrared ray protection glass 120 except for its first and second surfaces 121, 122, so that the infrared ray protection glass 120 is not easily separated or detached from the encapsulant 150. Of course, the infrared ray protection glass 120 is not easily separated by an external force because it is adhered to the adhesive 129 other than the encapsulant 150. Also, the encapsulant 150 has a first approximately planar surface 151 and a second approximately planar surface 152 which extends from an end (edge) of the first surface 151 while forming a right angle with respect to the first surface 151. Here, the first surface 121 of the infrared ray protection glass 120 is exposed outwardly through the first surface 151 of the encapsulant 150 and simultaneously may projects slightly from the first surface 151 of the encapsulant 150. The second surface 152 of the encapsulant 150 may be flush with the third surface 133 of the substrate 130, but the present invention is not limited to this structure. Also, the encapsulant 150 may be an epoxy molding compound using a mold and a molding method, an under fill using a dispenser and a dispensing method or equivalents thereof, but its material need not be limited to these.

The mount holder 160 is adhered on the first surface 151 of the encapsulant 150 along an outer periphery of the infrared ray protection glass 120 by means of the adhesive 169. Of course, the adhesive 169 may be also an ordinary one such as an epoxy adhesive, a double-faced adhesive tape, a double-faced adhesive film or equivalents thereof, but its type need not be limited to these. The mount holder 160 may takes a roughly hollow cylindrical shape so as to deliver the external image to the image sensing region 113. Of course, this mount holder 160 may be modified into diverse shapes including a rectangular shape, a pentagonal shape, etc., and its shape need not be limited to the cylindrical shape. Also, the mount holder 160 is formed on its inner diametrical surface with a plurality of threads 161 into which the barrel 170 to be described later can be screwed. Such a mount holder 160 may be made of ordinary material such as thermoplastic, thermoset, ceramic or equivalents thereof, but its material need not be limited to these. The mount holder 160 has a width similar to that of the image sensor die 110. Consequently, the overall width of the image sensor package 100 does not become larger due to the mount holder 160. That is, the size of the package 100 becomes smaller than that of the conventional package.

The barrel 170 may also take a roughly hollow cylindrical shape, but the present invention is not limited to this shape. The barrel 170 is formed on its outer diametrical surface with a plurality of threads 171 corresponding to the threads 161 of the mount holder 160, so that it can be screwed down into the mount holder 160. In addition, the barrel 170 has a plurality of internal recesses 172 in which a plurality of lenses 173 are engaged, respectively. Here, the barrel 170 may be also made of thermoplastic, thermoset, ceramic or equivalents thereof, but its material need not be limited to these. The plurality of lenses 173 functions to appropriately focus the external image and make light reach the image sensing region 113 in quantity as much as possible. Although three convex lenses 173 are shown in the drawing, the lens 173 is not limited in number and form to this. The number of the lenses 173 may be more or less than three, and the lens 173 may take a mixed form of convex and concave lenses.

Figure 2:
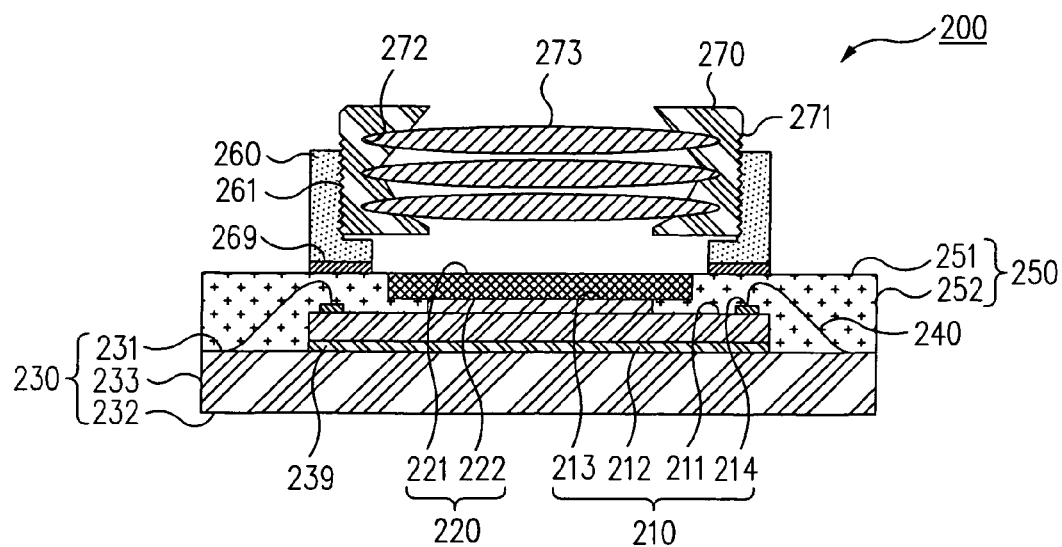
FIG. 2 is a sectional view of an image sensor package in accordance with another embodiment of the present invention.

Referring to FIG. 2, an image sensor package 200 in accordance with another embodiment of the present invention is shown in section.

Since the image sensor package 200 according to this embodiment has a similar structure to that of the above-mentioned image sensor package 100, only differences between them will be described below. Second surface 212, bond pads 214, substrate 230, first surface 231, second surface 232, third surface 233, adhesive 239, electrically conductive wires 240, second surface 252, mount holder 260, threads 261, adhesive 269, barrel 270, threads 271, recesses 272, lenses 273 of image sensor package 200 of FIG. 2 are substantially similar to second surface 112, bond pads 114, substrate 130, first surface 131, second surface 132, third surface 133, adhesive 139, electrically conductive wires 140, second surface 152, mount holder 160, threads 161, adhesive 169, barrel 170, threads 171, recesses 172, lenses 173 of image sensor package 100 of FIG. 1, respectively.

As shown in the drawing, an infrared ray protection glass 220 is seated directly on an image sensing region 213 of an image sensor die 210. That is, a second surface 222 of the infrared ray protection glass 220 comes in direct contact with the image sensing region 213. Also, no adhesive is interposed between a first surface 211 of the image sensor die 210 and the second surface 222 of the infrared ray protection glass 220. Moreover, a first surface 221 of the infrared ray protection glass 220 is flush with a first surface 251 of the encapsulant 250. In this way, the image sensor package 200 according to this embodiment of the present invention requires no adhesive as needed in the above-mentioned image sensor package 100 by seating the infrared ray protection glass 220 directly on the image sensing region 213 of the image sensor die 210. Furthermore, since there is no space between the infrared ray protection glass 220 and the image sensing region 213, it is little probable that image distortion occurs.

Figure 3:
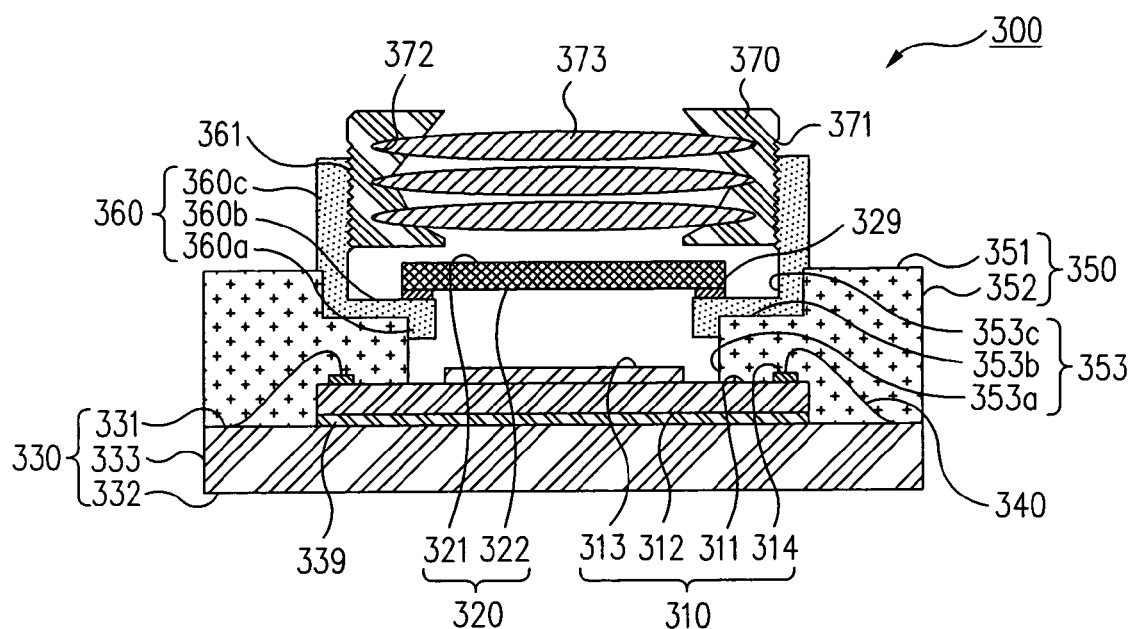
FIG. 3 is a sectional view of an image sensor package in accordance with still another embodiment of the present invention.

Referring to FIG. 3, an image sensor package 300 in accordance with another embodiment of the present invention is shown in section.

Since the image sensor package 300 according to this embodiment has a similar structure to that of the above-mentioned image sensor package 200, only differences between them will be described below. Second surface 312, bond pads 314, first surface 321, second surface 322, substrate 330, first surface 331, second surface 332, third surface 333, adhesive 339, electrically conductive wires 340, second surface 352, threads 361, threads 371, recesses 372, lenses 373 of image sensor package 300 of FIG. 3 are substantially similar to second surface 212, bond pads 214, first surface 221, second surface 222, substrate 230, first surface 231, second surface 232, third surface 233, adhesive 239, electrically conductive wires 240, second surface 252, threads 261, threads 271, recesses 272, lenses 273 of image sensor package 200 of FIG. 2, respectively.

As shown in the drawing, an encapsulant 350 has a predetermined-shaped cavity surface 353 in its portion corresponding to the outside of an image sensing region 313 of an image sensor die 310. To be specific, the cavity surface 353 consists of a first cavity surface 353a which is formed perpendicularly to a first surface 311 of the image sensor die 310 outside the image sensing region 313, a second cavity surface 353b which is formed parallel with the first surface 311 outside the first cavity surface 353a, and a third cavity surface 353c which is formed upwardly from the second cavity surface 353b and perpendicularly to the first surface 311. Of course, the third cavity surface 353c has a larger width than that of the first cavity surface 353a.

Next, a mount holder 360 having a predetermined shape is joined to the cavity surface 353. That is, the mount holder 360 consists of a first holder 360a coming in contact with the first cavity surface 353a, a second holder 360b coming in contact with the second cavity surface 353b and a third holder 360c coming in contact with the third cavity surface 353c. Of course, the third holder 360c further extends by a certain length out of a first surface 351 of the encapsulant 350. Also, an infrared ray protection glass 320 is adhered to the second holder 360b of the mount holder 360 by means of an adhesive 329, and a barrel 370 having a plurality of lenses 373 is screwed into the inside of the third holder 360c above the infrared ray protection glass 320.

Figure 4:
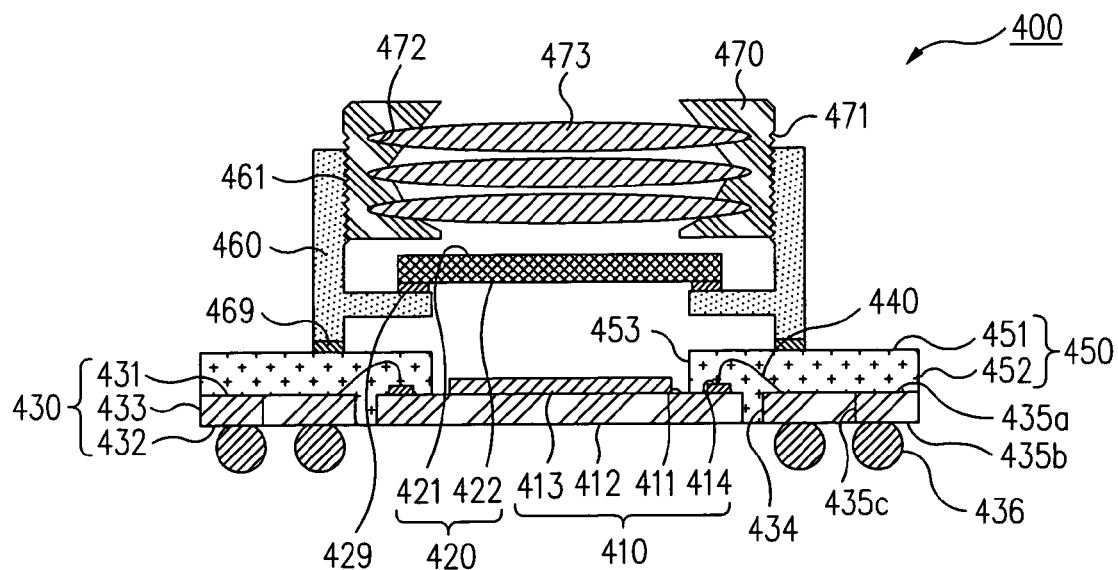
FIG. 4 is a sectional view of an image sensor package in accordance with still yet another embodiment of the present invention.

Referring to FIG. 4, an image sensor package 400 in accordance with another embodiment of the present invention is shown in section.

Since the image sensor package 400 according to this embodiment has a similar structure to that of the above-mentioned image sensor package 300, only differences between them will be described below. First surface 421, second surface 422, adhesive 429, third surface 433, first surface 451, second surface 452, threads 461, threads 471, recesses 472 of image sensor package 400 of FIG. 4 are substantially similar to first surface 321, second surface 322, adhesive 329, third surface 333, first surface 351, second surface 352, threads 361, threads 371, recesses 372 of image sensor package 300 of FIG. 3, respectively.

As shown in the drawing, a substrate 430 is formed with a cavity surface 434 of a certain width, in which an image sensor die 410 can be located. Of course, the cavity surface 434 has a larger width than that of the image sensor die 410 so that the image sensor die 410 can be sufficiently seated therein. Also, a first surface 431 and a second surface 432 of the substrate 430 are formed with electrically conductive patterns 435a, 435b which are connected to each other through an electrically conductive via hole 435c. A plurality of solder balls 436 are welded to the electrically conductive pattern 435b formed on the second surface 432. Moreover, bond pads 414 of the image sensor die 410 located in the cavity surface 434 of the substrate 430 are electrically connected to the electrically conductive pattern 435a formed on the first surface 431 of the substrate 430.

An encapsulant 450 covers the bond pads 414 of the image sensor die 410, electrically conductive wires 440 and a predetermined region of the substrate 430. Here, since a second surface 412 of the image sensor die 410 is flush with the second surface 432 of the substrate 430, the second surface 412 of the image sensor die 410 is exposed to the outside of the encapsulant 450. Of course, an image sensing region 413 formed on a first surface 411 of the image sensor die 410 is exposed to the outside of the encapsulant 450 through another cavity surface 453. That is, the cavity surface 453 is formed perpendicularly to the first surface 411 outside the image sensing region 413.

In addition, a mount holder 460 is adhered on the encapsulant 450 by means of an adhesive 469, and an infrared ray protection glass 420 and a barrel 470 with a plurality of lenses 473 are coupled to the mount holder 460 as described above.

Figure 5:
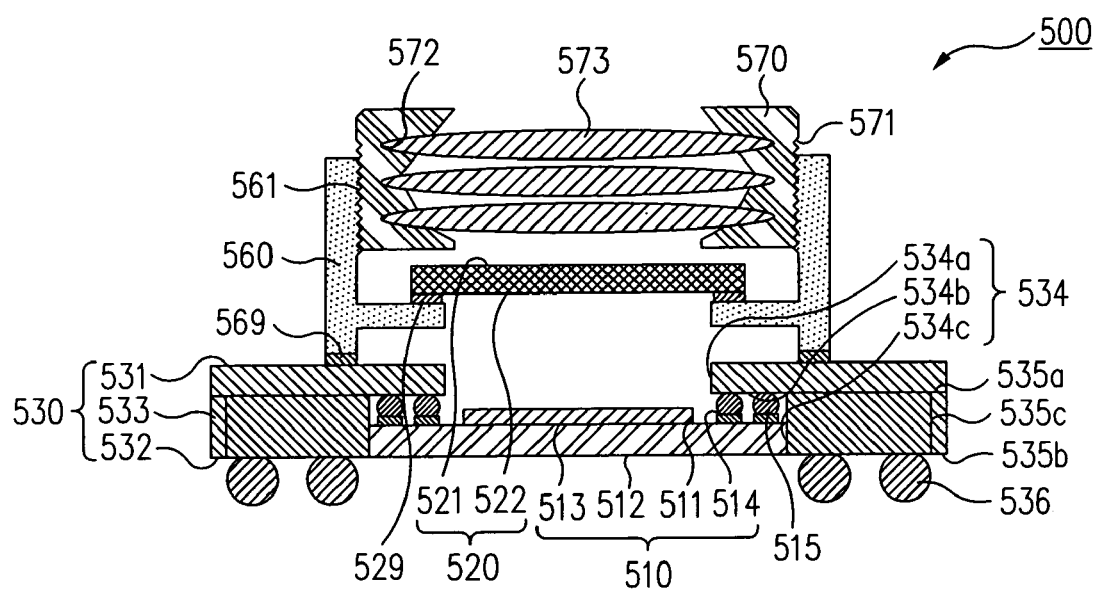
FIG. 5 is a sectional view of an image sensor package in accordance with still yet another embodiment of the present invention.

Referring to FIG. 5, an image sensor package 500 in accordance with another embodiment of the present invention is shown in section.

Since the image sensor package 500 according to this embodiment has a similar structure to that of the abovementioned image sensor package 400, only differences between them will be described below. First surface 511, infrared ray protection glass 520, first surface 521, second surface 522, adhesive 529, third surface 533, solder balls 536, threads 561, barrel 570, threads 571, recesses 572, lenses 573 of image sensor package 500 of FIG. 5 are substantially similar to first surface 411, infrared ray protection glass 420, first surface 421, second surface 422, adhesive 429, third surface 433, solder balls 436, threads 461, barrel 470, threads 471, recesses 472, lenses 473 of image sensor package 400 of FIG. 4, respectively.

As shown in the drawing, bond pads 514 which are formed at an outer periphery of an image sensing region 513 of an image sensor die 510 have electrically conductive bumps 515, respectively. That is, the bond pads 514 are formed with the electrically conductive bumps 515 instead of electrically conductive wires. Such electrically conductive bumps 515 may be made of ordinary material such as Au, Ag, Sn/Pb or equivalents thereof, but its material need not be limited to these.

A substrate 530 is formed with a cavity surface 534 as described above, in which an image sensor die 510 can be located. To be specific, the cavity surface 534 consists of a first cavity surface 534a for enabling external light to be incident to the image sensing region 513 of the image sensor die 510, a second cavity surface 534b which is formed outside the first cavity surface 534b and to which the electrically conductive bumps 515 are welded, and a third cavity surface 534c which is formed outside the second cavity surface 534b and to which the image sensor die 510 is joined. Of course, the third cavity surface 534c has a larger width than that of the first cavity surface 534a. Also, the second cavity surface 534b is formed with an electrically conductive pattern 535a to which the electrically conductive bumps 515 are welded. It is obvious that the electrically conductive pattern 535a is connected to another electrically conductive pattern 535b formed on a second surface 532 of the substrate 530 through an electrically conductive via hole 535c. The third cavity surface 534c of the cavity surfaces 534 of the substrate 530 has the same width as that of the image sensor die 510. Thus, the image sensor die 510 is tightly joined to the third cavity surface 534c of the substrate 530. Moreover, a second surface 512 of the image sensor die 510 may be flush with the second surface 532 of the substrate 530, but the present invention is not limited to this.

Meanwhile, the image sensor package 500 has no encapsulant. That is, since a mount holder 560 is adhered directly on a first surface 531 of the substrate 530 by means of an adhesive 569, the image sensing region 513 of the image sensor die 510 is isolated from the outside. Furthermore, particles never infiltrates the image sensing region 513 from any direction because the widths of the image sensor die 510 and the third cavity surface 534c of the substrate 530 are the same as stated above, In this way, the overall thickness of the image sensor package 500 according to this embodiment becomes reduced due to the fact that the image sensor die 510 is located in the cavity surface 534 of the substrate 530. Moreover, since there is no encapsulant, the package 500 has a simple structure and thus its manufacturing cost can be is saved.

Figure 6:
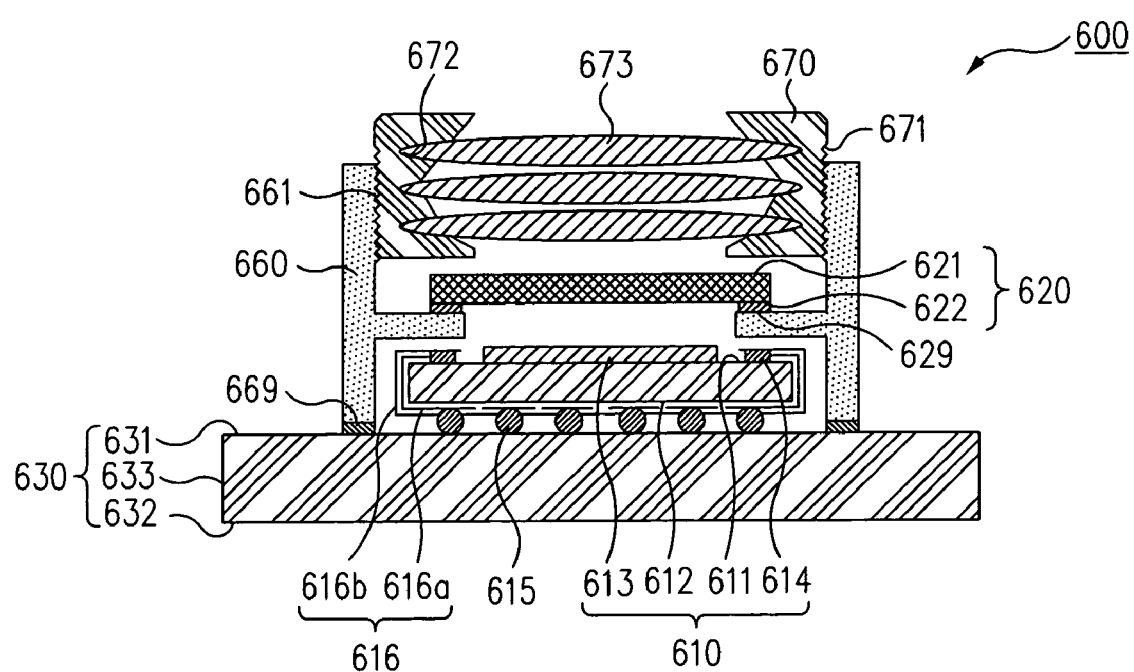
FIG. 6 is a sectional view of an image sensor package in accordance with still yet another embodiment of the present invention.

Referring to FIG. 6, an image sensor package 600 in accordance with another embodiment of the present invention is shown in section.

Since the image sensor package 600 according to this embodiment has a similar structure to that of the abovementioned image sensor package 500, only differences between them will be described below. First surface 621, second surface 622, adhesive 629, third surface 633, threads 661, threads 671, recesses 672 of image sensor package 600 of FIG. 6 are substantially similar to first surface 521, second surface 522, adhesive 529, third surface 533, threads 561, threads 571, recesses 572 of image sensor package 500 of FIG. 5, respectively.

As shown in the drawing, a substrate 630 takes a flat plate-like form having a first surface 631 and a second surface 632 opposite to the first surface 631. That is, the substrate 630 is formed with no cavity surface.

An image sensor die 610 has an image sensing region 613 formed on its first surface 611 as stated above and a plurality of bond pads 614 formed outside the image sensing region 613. Here, an electrically conductive pattern film 616 is connected to the respective bond pads 614 and extends up to a second surface 612 of the image sensor die 610. This electrically conductive pattern film 616 consists of an electrically conductive pattern 616a and an insulative film 616b surrounding the electrically conductive pattern 616a. Also, a plurality of electrically conductive bumps 615 are welded to the electrically conductive pattern film 616 located on the second surface 612 of the image sensor die 610. Of course, such electrically conductive bumps 615 are electrically connected to the substrate 630 instead of electrically conductive wires.

In addition, a mount holder 660 is adhered to an outer periphery of the image sensor die 610 by means of an adhesive 669. It is obvious that an infrared ray protection glass 620 and a barrel 670 having a plurality of lenses 673 are coupled to the inside of the mount holder 660.

In this way, an encapsulant is removed from the image sensor package 600 according to this embodiment, so that the package 600 has a simple structure and its manufacturing cost can be saved.

Figure 7:
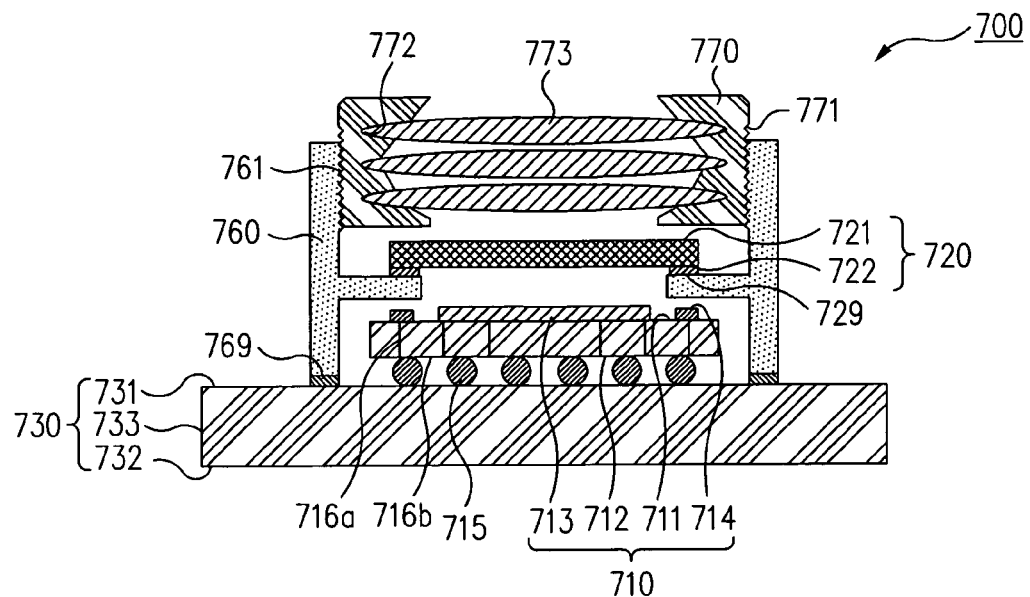
FIG. 7 is a sectional view of an image sensor package in accordance with still yet another embodiment of the present invention.

FIG. 7 shows a sectional view of an image sensor package 700 in accordance with another embodiment of the present invention.

Since the image sensor package 700 according to this embodiment has a similar structure to that of the above-mentioned image sensor package 600, a description centering around differences between them will be given below. Image sensing region 713, infrared ray protection glass 720, first surface 721, second surface 722, adhesive 729, first surface 731, second surface 732, third surface 733, mount holder 760, threads 761, adhesive 769, barrel 770, threads 771, recesses 772, and lenses 773 of image sensor package 700 of FIG. 7 are substantially similar to image sensing region 613, infrared ray protection glass 620, first surface 621, second surface 622, adhesive 629, first surface 631, second surface 632, third surface 633, mount holder 660, threads 661, adhesive 669, barrel 670, threads 671, recesses 672, and lenses 673 of image sensor package 600 of FIG. 6, respectively.

As shown in the drawing, an image sensor die 710 is formed in its region corresponding to bond pads 714 with electrically conductive via holes 716a extending from its first surface 711 to its second surface 712. Also, the second surface 712 is formed with a plurality of electrically conductive patterns 716b connected to the electrically conductive via holes 716a. The electrically conductive patterns 716b are in turn formed with electrically conductive bumps 715, respectively, and the electrically conductive bumps 715 are electrically connected to a substrate 730. In contrast with the above-mentioned image sensor package 600, that is, the image sensor package 700 according to this embodiment does not use an electrically conductive pattern film, but uses the electrically conductive via holes 716a and the electrically conductive patterns 716b.

In this way, the image sensor package 700 has no encapsulant, thereby having a simple structure and saving its manufacturing cost.

Figure 8:
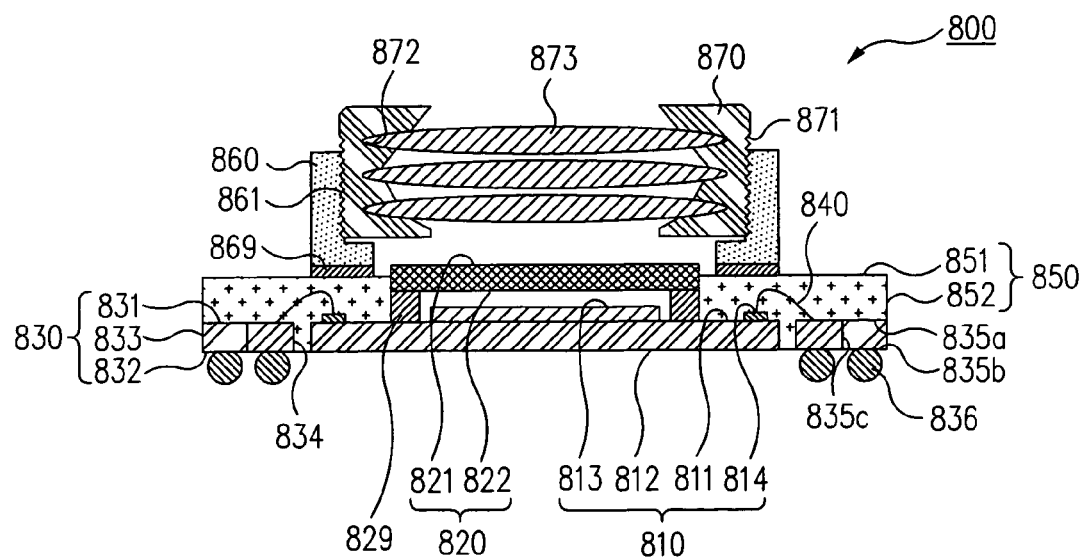
FIG. 8 is a sectional view of an image sensor package in accordance with still yet another embodiment of the present invention.

Referring to FIG. 8, an image sensor package 800 in accordance with another embodiment of the present invention is shown in section.

Since the image sensor package 800 according to this embodiment has a similar structure to that of the above-mentioned image sensor package 700, a description centering around differences between them will be given below. Third surface 833, first surface 851, second surface 852, threads 861, threads 871, recesses 872 of image sensor package 800 of FIG. 8 are substantially similar to third surface 733, first surface 751, second surface 752, threads 761, threads 771, recesses 772 of image sensor package 700 of FIG. 7, respectively.

As shown in the drawing, an image sensor die 810 has a first approximately planar surface 811 and a second approximately planar surface 812 opposite to the first surface 811. The first surface 811 of the image sensor die 810 is formed in about its middle portion with an image sensing region 813 for sensing an external image and converting it into an electrical signal, and at least a bond pad 814 is formed outside the first surface 812 at a distance from the image sensing region 813. In other words, the bond pad 814 is mainly formed just inside edges of the first surface 811 of the image sensor die 810.

An infrared ray protection glass 820 is located above the image sensing region 813 of the image sensor die 810. Of course, the infrared ray protection glass 820 has a larger area than that of the image sensing region 813 so that it can completely cover the image sensing region 813. Also, an adhesive 829 having a larger thickness than that of the image sensing region 813 is attached to the first surface 811 of the image sensor die 810 outside the image sensing region 813, and the infrared ray protection glass 820 is adhered on the adhesive 829. To be specific, the infrared ray protection glass 820 has a first approximately planar surface 821 and a second approximately planar surface 822 opposite to the first surface 821, and is adhered to the adhesive 829 at the second surface 822. This adhesive 829 may be an ordinary one such as an epoxy adhesive, a double-faced adhesive tape, a double-faced adhesive film or equivalents thereof, but its type need not be limited to these. In addition, the infrared ray protection glass 820 serves to intercept infrared rays incident to the image sensing region 813, thereby preventing the deterioration of image quality.

A substrate 830 is formed with a cavity surface 834 of a certain width, in which the image sensor die 810 can be located. Of course, the cavity surface 834 has a larger width than that of the image sensor die 810 so that the image sensor die 810 can be sufficiently seated therein. Also, a first surface 831 and a second surface 832 of the substrate 830 are formed with electrically conductive patterns 835a, 835b which are connected to each other through an electrically conductive via hole 835c. A plurality of solder balls 836 are welded to the electrically conductive pattern 835b formed on the second surface 832. Moreover, bond pads 814 of the image sensor die 810 located in the cavity surface 834 of the substrate 830 are electrically connected to the electrically conductive pattern 835a formed on the first surface 831 of the substrate 830.

An encapsulant 850 covers the bond pads 814, electrically conductive wires 840 and a predetermined region of the substrate 830 outside the infrared ray protection glass 820 and the adhesive 829 adhered to the image sensor die 810. Here, since a second surface 812 of the image sensor die 810 is flush with the second surface 832 of the substrate 830, the second surface 812 of the image sensor die 810 is exposed to the outside of the encapsulant 850. Of course, infrared ray protection glass 820 located above an image sensing region 813 of the image sensor die 810 is exposed to the outside of the encapsulant 850.

In addition, a mount holder 860 is adhered on the encapsulant 850 by means of an adhesive 869, and a barrel 870 with a plurality of lenses 873 are coupled to the mount holder 860 as described above.

Hereinafter, a method for manufacturing an image sensor package according to the present invention will be described. Herein, a description of the manufacturing method will be given on the basis of the image sensor package 100 shown in FIG. 1.

Figure 9:
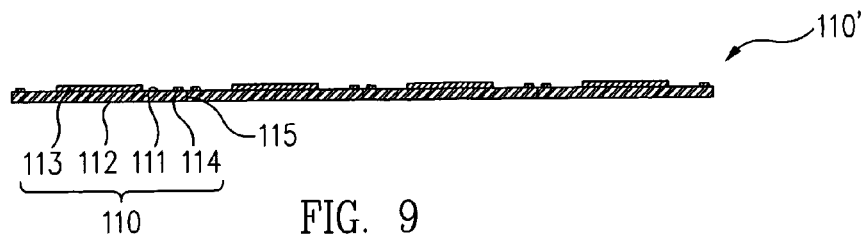
FIG. 9 is a sectional view showing an operation of providing a wafer in a manufacturing method of an image sensor package in accordance with the present invention.

First, referring to FIG. 9, an operation of providing a wafer in the manufacturing method of an image sensor package according to the present invention is illustrated.

As shown in the drawing, the wafer 110' may consist of a plurality of image sensor dies 110. Of course, the respective image sensor dies 110 are separated later into pieces by being sawn along a scribe line 115 in a sawing process. Also, the respective image sensor dies 110 have an image sensing region 113 formed in a middle portion of its one surface, and a plurality of bond pads 114 are formed outside the image sensing region 113. Here, although four image sensor dies 110 are sown in the drawing, more image sensor dies 110 are actually formed in one wafer 110'. Reference numeral "111" in the drawing designates a first surface on which the image sensing region 113 and the bond pads 114 of the image sensor die 110 are formed, and reference numeral "112" designated a second surface opposite the first surface 111.

Figure 10:
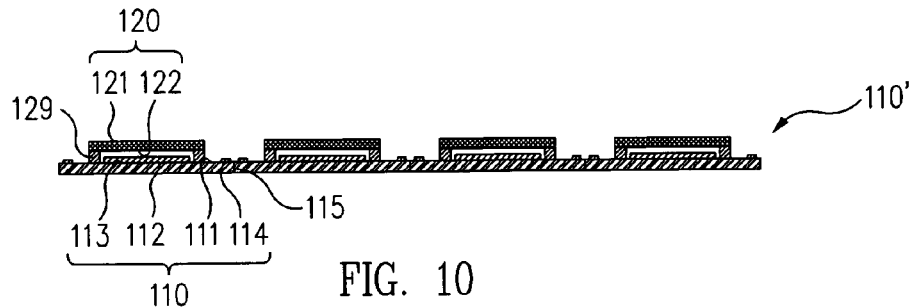
FIG. 10 is a sectional view showing an operation of attaching an infrared ray protection glass on an image sensor die in the manufacturing method of an image sensor package in accordance with the present invention.

Next, referring to FIG. 10, an operation of attaching an infrared ray protection glass in the manufacturing method of an image sensor package according to the present invention is illustrated.

As shown in the drawing, first of all, an adhesive 129 of a certain thickness is adhered to an outer periphery of an image sensing region 113 of an image sensor die 110. Here, the adhesive 129 may be thicker than a thickness of the image sensing region 113. Such an adhesive 129 may be an ordinary one such as an epoxy adhesive, a double-faced adhesive tape, a double-faced adhesive film or equivalents thereof, but its type need not be limited to these. After the adhesive 129 is formed, an infrared ray protection glass 120 is adhered on the adhesive 129 to completely isolate the image sensing region 113 from the outside. In this way, the present invention already isolate the image sensing region 113 from the outside when it is in the wafer, thereby perfectly preventing the image sensing region 113 from being contaminated with particles in further operations of die sawing, wire bonding and encapsulation. As a matter of course, this leads to minimizing the lowering in optical performance of the image sensor package according to the present invention. Reference numeral "121" designates a first approximately planar surface of the infrared ray protection glass 120, and reference numeral "122" designates a second approximately planar surface opposite to the first surface 121.

Figure 11:
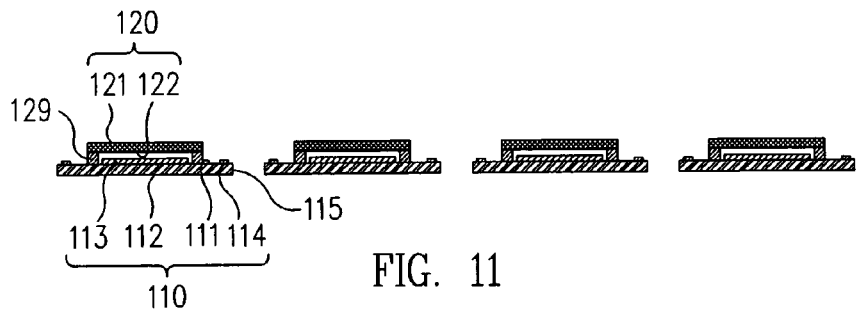
FIG. 11 is a sectional view showing an operation of sawing the wafer into image sensor die pieces in the manufacturing method of an image sensor package in accordance with the present invention.

Next, referring to FIG. 11, a die sawing operation in the manufacturing method of an image sensor package according to the resent invention is illustrated.

After the process of attaching the infrared ray protection glass 120 on the wafer is completed, the scribe line 115 is sawn by a diamond blade, etc. to separate the wafer into image sensor dies 110. At this time, the image sensing region 113 of the image sensor die 110 is already covered with the infrared ray protection glass 120. Therefore, even if many particles are generated during the sawing process by the diamond blade, the particles do not infiltrate the image sensing region 113. That is, in spite of the sawing process, optical performance of the image sensor die is not lowered.

Figure 12:
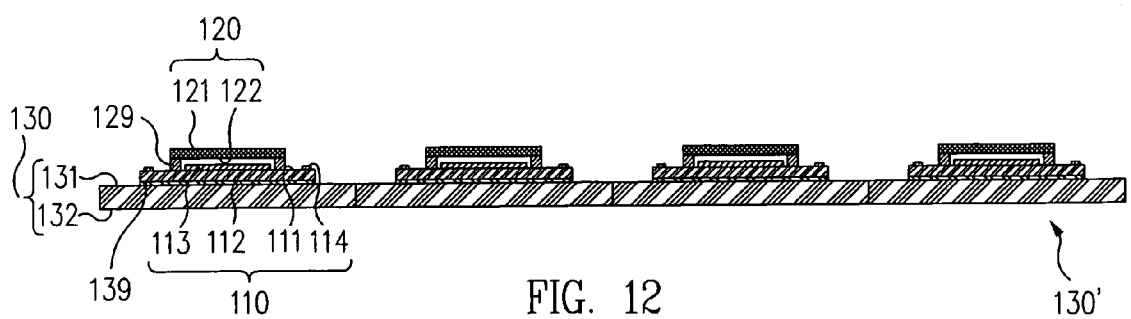
FIG. 12 is a sectional view showing an operation of attaching the image sensor die on the substrate in the manufacturing method of an image sensor package in accordance with the present invention.

Next, referring to FIG. 12, a die attaching operation in the manufacturing method of an image sensor package according to the present invention is illustrated.

As shown in the drawing, an adhesive 139 is attached on the second surface 112 opposite to the surface on which the image sensing region 113 of the image sensor die 110 is formed, and then the image sensor die 110 is adhered to a predetermined region of the first surface 131 of a substrate 130. Of course, the substrate 130 may takes a form of a strip 130' in order to maximize a yield. That is, a number of image sensor dies 110 are adhered on one substrate strip 130' so as to manufacture many image sensor packages with one strip 130'. Here, although not shown, the substrate may be an ordinary one such as a hard printed circuit board, a soft printed circuit board, a lead frame or equivalents thereof, but its material and structure need not to be limited to these. Of course, electrically conductive patterns or leads (not shown) for wire bonding may be formed on a surface of the substrate 130. Also, the adhesive 139 for adhering the image sensor die 110 to the substrate 130 may be an ordinary one such as an epoxy adhesive, a double-faced adhesive tape, a double-faced adhesive film or equivalents thereof, but its material need not be limited to these.

Figure 13:
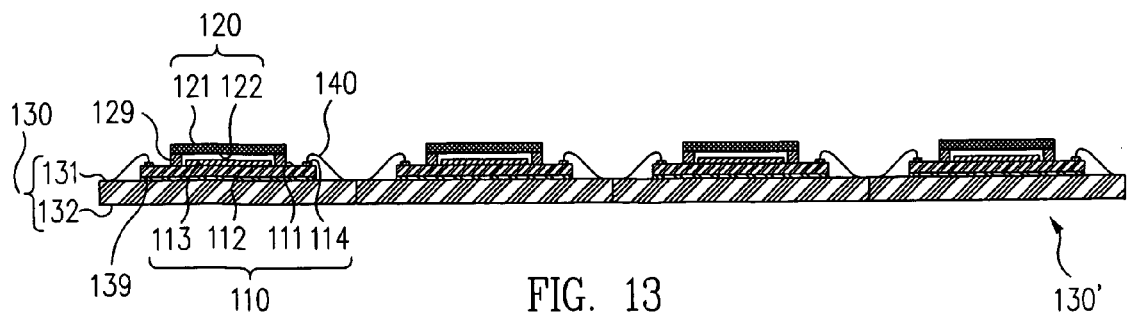
FIG. 13 is a sectional view showing an operation of performing wire bonding between the image sensor die and the substrate in the manufacturing method of an image sensor package in accordance with the present invention.

Next, referring to FIG. 13, a wire bonding operation in the manufacturing method of an image sensor package according to the present invention is illustrated.

As shown in the drawing, bond pads 114 formed on the image sensor die 110 outside the infrared ray protection glass 120 are electrically connected to a predetermined region of the substrate 130 by means of electrically conductive wires 140. That is, the bond pads 114 of the image sensor die 110 are electrically connected to the electrically conductive patterns or leads (not shown) formed on the substrate 130. Of course, if this wire bonding is performed by an Ag wire bonder (not shown), the electrically conductive wires 140 may be ordinary ones such as an Au wire, an Ag wire, an Al wire, a Cu wire or equivalents thereof, but its material need not be limited to these.

Figure 14:
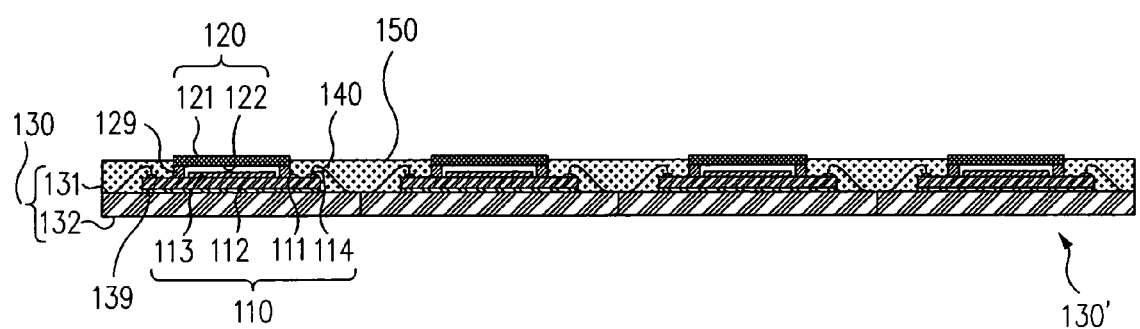
FIG. 14 is a sectional view showing an encapsulation operation in the manufacturing method of an image sensor package in accordance with the present invention.

Next, referring to FIG. 14, an encapsulation operation in the manufacturing method of an image sensor package according to the present invention is illustrated.

As shown in the drawing, all of the image sensor dies 110 and the electrically conductive wires 140 positioned on the substrate strip 130' are encapsulated by an encapsulant 150. At this time, at least a surface of the infrared ray protection glass 120 is exposed to the outside of the encapsulant 150. That is, since an external image must be transmitted to the image sensing region 113 through the infrared ray protection glass 120, the infrared ray protection glass 120 is exposed to the outside of the encapsulant 150. Such an encapsulation process with the encapsulant 150 may be performed by a modeling method using a mold or an under fill method using a dispenser.

In addition, although all the image sensor dies 110 are shown as being commonly encapsulated in the drawing, the respective image sensor dies 110 may be also independently encapsulated. That is, vacant spaces may be formed between the encapsulants 150 covering the respective image sensor dies 110.

Figure 15:
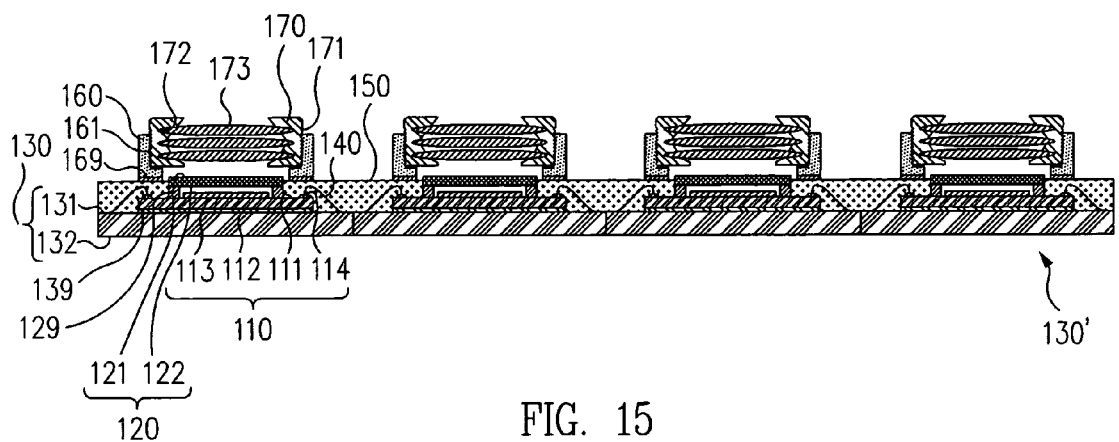
FIG. 15 is a sectional view showing an operation of attaching a mount holder in the manufacturing method of an image sensor package in accordance with the present invention.

Next, referring to FIG. 15, an operation of attaching a mount holder in the manufacturing method of an image sensor package according to the present invention is illustrated.

As shown in the drawing, a mount holder 160 is attached on a surface of the encapsulant 150 outside the infrared ray protection glass 120 by means of an adhesive 169. Of course, a barrel 170 with a plurality of lenses 173 is screwed into the inside of the mount holder.

Figure 16:
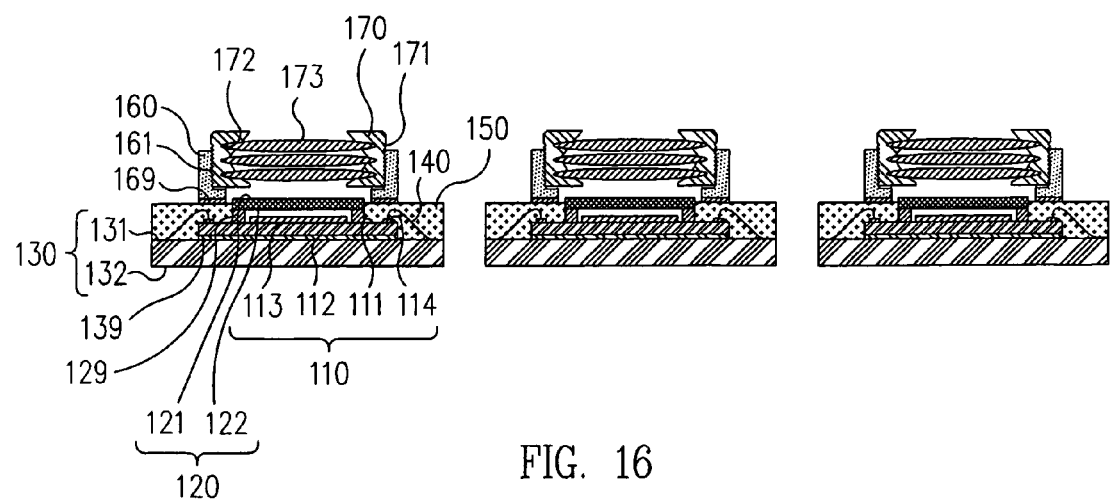
FIG. 16 is a sectional view showing a singulation operation in the manufacturing method of an image sensor package in accordance with the present invention.

Finally, referring to FIG. 16, a singulation operation in the manufacturing method of an image sensor package according to the present invention is illustrated.

As shown in the drawing, after the operation of attaching the mount holder 160 is completed, one substrate strip 130' is singulated into individual image sensor packages 100. That is, boundary regions between the individual image sensor packages 100 are separated by a diamond blade, a punch or the like. Of course, when the encapsulant 150 has no vacant space between the packages, it is suitable that the encapsulant 150 and the substrate 130 are also sawn by the diamond blade. Also, when the encapsulant 150 has vacant spaces between the packages (that is, when the substrate 130 is partially exposed), either a sawing method using a diamond blade or a punching method using a punch may be employed.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. An image sensor package comprising:
   an image sensor die having a first surface and a second surface opposite to the first surface, the first surface being formed in its middle portion with an image sensing region and being provided outside the image sensing region with at least a bond pad;
   an infrared ray protection glass covering the image sensing region of the image sensor die and having a first surface and a second surface opposite to the first surface of the infrared ray protection glass;
   a substrate being adhered on the second surface of the image sensor die;
   at least an electrically conductive wire electrically connecting the bond pad of the image sensor die and the substrate to each other; and
   an encapsulant encapsulating the image sensor die, the infrared ray protection glass, the substrate and the electrically conductive wire such that at least the first surface of the infrared ray protection glass is exposed outwardly, the encapsulant directly contacting and enclosing the first surface of the image sensor die outward of the image sensing region.

2. An image sensor package comprising:
   an image sensor die having a first surface and a second surface opposite to the first surface, the first surface being formed in its middle portion with an image sensing region and being provided outside the image sensing region with at least a bond pad;
   an infrared ray protection glass covering the image sensing region of the image sensor die and having a first surface and a second surface opposite to the first surface of the infrared ray protection glass;
   an adhesive having a larger thickness than that of the image sensing region interposed between the first surface of the image sensor die and the second surface of the infrared ray protection glass;
   a substrate being adhered on the second surface of the image sensor die;
   at least an electrically conductive wire electrically connecting the bond pad of the image sensor die and the substrate to each other; and
   an encapsulant encapsulating the image sensor die, the infrared ray protection glass, the substrate and the electrically conductive wire such that at least the first surface of the infrared ray protection glass is exposed outwardly.

3. The image sensor package as claimed in claim 1, wherein the second surface of the infrared ray protection glass comes in direct contact with the image sensing region.

4. An image sensor package comprising:
   an image sensor die having a first surface and a second surface opposite to the first surface, the first surface being formed in its middle portion with an image sensing region and being provided outside the image sensing region with at least a bond pad;
   an infrared ray protection glass covering the image sensing region of the image sensor die and having a first surface and a second surface opposite to the first surface of the infrared ray protection glass;
   a substrate being adhered on the second surface of the image sensor die;
   at least an electrically conductive wire electrically connecting the bond pad of the image sensor die and the substrate to each other; and
   an encapsulant encapsulating the image sensor die, the infrared ray protection glass, the substrate and the electrically conductive wire such that at least the first surface of the infrared ray protection glass is exposed outwardly,
   wherein the first surface of the infrared ray protection glass is exposed outwardly while projecting from a surface of the encapsulant by a certain height.

5. The image sensor package as claimed in claim 1, wherein the first surface of the infrared ray protection glass is flush with a surface of the encapsulant.

6. The image sensor package as claimed in claim 1, wherein a hollow mount holder is further adhered on a surface of the encapsulant along an outer periphery of the infrared ray protection glass, and a barrel with a plurality of lenses is further coupled to the inside of the mount holder.

7. The image sensor package as claimed in claim 6, wherein the mount holder has a width equal to or less than that of the image sensor die.

8. The image sensor package as claimed in claim 6, wherein the mount holder and the barrel are screwed to each other.

9. An image sensor package comprising:
   an image sensor die having a first surface and a second surface opposite to the first surface, the first surface being formed in its middle portion with an image sensing region and being provided outside the image sensing region with at least a bond pad;
   an infrared ray protection glass covering the image sensing region of the image sensor die and having a first surface and a second surface opposite to the first surface of the infrared ray protection glass;
   a substrate being formed with a cavity surface in which the image sensor die is located;
   at least an electrically conductive wire electrically connecting the bond pad of the image sensor die and the substrate to each other; and
   an encapsulant encapsulating the image sensor die, the infrared ray protection glass, the substrate and the electrically conductive wire such that the infrared ray protection glass and the second surface of the image sensor die are exposed outwardly, the encapsulant directly contacting and enclosing the first surface of the image sensor die outward of the image sensing region.

10. An image sensor package comprising:
    an image sensor die having a first surface and a second surface opposite to the first surface, the first surface being formed in its middle portion with an image sensing region and being provided outside the image sensing region with at least a bond pad;
    an infrared ray protection glass covering the image sensing region of the image sensor die and having a first surface and a second surface opposite to the first surface of the infrared ray protection glass;
    an adhesive having a larger thickness than that of the image sensing region interposed between the first surface of the image sensor die and the second surface of the infrared ray protection glass;
    a substrate being formed with a cavity surface in which the image sensor die is located;
    at least an electrically conductive wire electrically connecting the bond pad of the image sensor die and the substrate to each other; and
    an encapsulant encapsulating the image sensor die, the infrared ray protection glass, the substrate and the electrically conductive wire such that the infrared ray protection glass and the second surface of the image sensor die are exposed outwardly.

11. The image sensor package as claimed in claim 9, wherein a hollow mount holder is further adhered on a surface of the encapsulant along an outer periphery of the infrared ray protection glass, and a barrel with a plurality of lenses is further coupled to an inner side of the mount holder.

12. The image sensor package as claimed in claim 11, wherein the mount holder has a width equal to or less than that of the image sensor die.

13. The image sensor package as claimed in claim 11, wherein the mount holder and the barrel are screwed to each other.

14. The image sensor package as claimed in claim 11, wherein a plurality of electrically conductive patterns which are bonded to the image sensor die by the electrically conductive wire are further formed on a surface of the substrate.

15. The image sensor package as claimed in claim 14, wherein a plurality of solder balls are further welded on the surface of the substrate.

16. A method for manufacturing an image sensor package, the method comprising:
    providing a wafer including at least an image sensor die which is formed on its one surface with an image sensing region and a bond pad;
    seating an infrared ray protection glass on the image sensing region of the image sensor die;
    sawing the wafer into image sensor dies;
    attaching at least one of the sawn image sensor dies on a substrate of a substrate strip;
    bonding the image sensor die and the substrate to each other by an electrically conductive wire;
    encapsulating the image sensor die, the infrared ray protection glass, the substrate and the electrically conductive wire with an encapsulant such that the infrared ray protection glass is exposed outwardly, the encapsulant directly contacting and enclosing the image sensor die outward of the image sensing region;
    adhering a mount holder to which a barrel with a plurality of lenses is coupled on a surface of encapsulant; and
    singulating the substrate strip into image sensor packages.

17. A method for manufacturing an image sensor package, the method comprising:
    providing a wafer including at least an image sensor die which is formed on its one surface with an image sensing region and a bond pad;
    seating an infrared ray protection glass on the image sensing region of the image sensor die performed by adhering an adhesive on an outer periphery of the image sensing region and adhering the infrared ray protection glass to the adhesive;
    sawing the wafer into image sensor dies;
    attaching at least one of the sawn image sensor dies on a substrate of a substrate strip;
    bonding the image sensor die and the substrate to each other by an electrically conductive wire;
    encapsulating the image sensor die, the infrared ray protection glass, the substrate and the electrically conductive wire with an encapsulant such that the infrared ray protection glass is exposed outwardly;
    adhering a mount holder to which a barrel with a plurality of lenses is coupled on a surface of encapsulant; and
    singulating the substrate strip into image sensor packages.

18. The method as claimed in claim 16 wherein the infrared ray protection glass protects the image sensing region during the sawing.

19. The method as claimed in claim 16 wherein the barrel is screwed to the mount holder.

20. The method as claimed in claim 16 wherein the adhering a mount holder to which a barrel with a plurality of lenses is coupled on a surface of encapsulant is performed using an adhesive.

* * * * *